United States Patent [19]
Haase et al.

[11] Patent Number: 5,963,573
[45] Date of Patent: Oct. 5, 1999

[54] LIGHT ABSORBING LAYER FOR II-VI SEMICONDUCTOR LIGHT EMITTING DEVICES

[75] Inventors: Michael A. Haase, Woodbury; Paul F. Baude, Maplewood, both of Minn.

[73] Assignee: 3M Innovative Properties Company, St. Paul, Minn.

[21] Appl. No.: 08/920,179

[22] Filed: Aug. 25, 1997

[51] Int. Cl.[6] .............................. H01S 3/19; H01L 33/00
[52] U.S. Cl. ................................ 372/46; 372/45; 257/94; 257/103
[58] Field of Search ..................... 372/43–46; 257/94, 257/96, 97, 103

[56] References Cited

U.S. PATENT DOCUMENTS

| | | | |
|---|---|---|---|
| 5,213,998 | 5/1993 | Qiu et al. | 438/46 |
| 5,248,631 | 9/1993 | Park et al. | 438/22 |
| 5,274,269 | 12/1993 | DePuydt et al. | 257/744 |
| 5,291,507 | 3/1994 | Haase et al. | 372/44 |
| 5,319,219 | 6/1994 | Cheng et al. | 257/14 |
| 5,395,791 | 3/1995 | Cheng et al. | 438/47 |
| 5,396,103 | 3/1995 | Oiu et al. | 257/744 |
| 5,404,027 | 4/1995 | Haase et al. | 257/13 |
| 5,422,902 | 6/1995 | Mensz | 372/43 |
| 5,477,063 | 12/1995 | Shakuda | 372/45 |
| 5,488,233 | 1/1996 | Ishikawa et al. | 372/45 |
| 5,495,493 | 2/1996 | Kurihara et al. | 372/44 |
| 5,513,199 | 4/1996 | Haase et al. | 372/44 |
| 5,742,629 | 4/1998 | Nishikawa et al. | 372/46 |

OTHER PUBLICATIONS

Mayer et al, Electronic Materials Science: For Integrated Circuits in SI and GaAs, New York: MacMillan Publishing Company, 1990, the page on the inside of back cover, 1990.
"Alternate Materials for II–VI Light Emitting Diodes and Lasers," by G. Landwehr et al., Plenary Talk of Prof. G. Landwehr at International Symposium, Mar. 5–7, 1996.
"BeTe/ZnSe Graded Band Gap Ohmic Contacts to p–ZnSe," by P.M. Mensz, *Appl. Phys. Lett.*, vol. 64, No. 16, Apr. 1994, pp. 2148–2150.
"Design of Ohmic Contacts to p–ZnSe," by R.G. Dandrea et al., *Appl. Phys. Lett.*, vol. 64, No. 16, Apr. 1994, pp. 2145–2147.
"Laser Diodes Based on Beryllium–Chalcogenides," by A. Waag et al., *Appl. Phys. Lett.*, Jan. 1997, pp. 280–282.

*Primary Examiner*—Rodney Bovernick
*Assistant Examiner*—Quyen Phan Leung
*Attorney, Agent, or Firm*—Judson K. Champlin; Philip Y. Dahl; Charles L. Dennis II

[57] ABSTRACT

A II–VI semiconductor light emitting device includes a II–VI semiconductor light emitting region and a II–VI semiconductor waveguide layer. A light absorbing layer is provided near the II–VI semiconductor waveguide layer, outside of the active region. The light absorbing layer absorbs extraneous radiation thereby reducing dark line defects (DLDs).

15 Claims, 2 Drawing Sheets

LIGHT ABSORBING LAYER FOR II-VI SEMICONDUCTOR LIGHT EMITTING DEVICES

GOVERNMENT RIGHTS

The United States government has certain rights in this invention pursuant to Contract No. DAAH 04-94-C-0049 awarded by the Defense Advanced Research Projects Agency and the Department of the Army/Army Research Office.

BACKGROUND OF THE INVENTION

The present invention relates to II–VI semiconductor devices such as laser diodes and light emitting diodes. More specifically, the present invention relates to a light absorbing layer for a II–VI semiconductor light emitting device.

Buried ridge (buried heterostructure) semiconductor devices are known. Such devices are useful in constructing light emitting or detecting devices, diodes and laser diodes such as those described in U.S. Pat. No. 5,213,998, issued May 25, 1993; U.S. Pat. No. 5,248,631, issued Sep. 28, 1993; U.S. Pat. No. 5,274,269, issued Dec. 28, 1993; U.S. Pat. No. 5,291,507, issued Mar. 1, 1994; U.S. Pat. No. 5,319,219, issued Jun. 7, 1994; U.S. Pat. No. 5,395,791, issued Mar. 7, 1995; U.S. Pat. No. 5,396,103, issued Mar. 7, 1995; U.S. Pat. No. 5,404,027, issued Apr. 4, 1995; U.S. Pat. No. 5,363,395, issued Nov. 8, 1994; U.S. Pat. No. 5,515,393, issued May 7, 1996; U.S. Pat. No. 5,420,446, issued May 30, 1995; U.S. Pat. No. 5,423,943, issued Jun. 13, 1995; U.S. Pat. No. 5,538,918, issued Jul. 23, 1996; and U.S. Pat. No. 5,513,199, issued Apr. 30, 1996.

Historically, laser diodes have generated infrared or red light. However, there are many applications where diodes which emit radiation in shorter wavelengths, for example, in the blue and green portions of the spectrum (i.e., at wavelengths between 590 nm and 430 nm) would be useful. Further, such short wavelength laser diodes would increase the performance and capabilities of many existing systems which currently use infrared and red laser diodes.

There is an on-going effort to improve performance and reliability of II–VI blue-green diodes. One failure mechanism in such devices is the formation of what are known as "dark line defects" (DLD).

SUMMARY OF THE INVENTION

The present invention includes a II–VI semiconductor light emitting device having a II–VI waveguide layer and an active (light generating) region. A light absorbing layer is provided proximate the II–VI waveguide layer and lying outside of the active region. The light absorbing layer absorbs extraneous light output and thereby reduces formation of dark line defects.

DETAILED DESCRIPTION OF THE PREFERRED EMBODIMENTS

The present invention provides reduced dark line defects (DLDs) in II–VI semiconductor light emitting devices. In the present invention, an absorbing layer is provided in a II–VI semiconductor device which absorbs extraneous light and thereby reduces generation of dark line defects.

Figure 1:
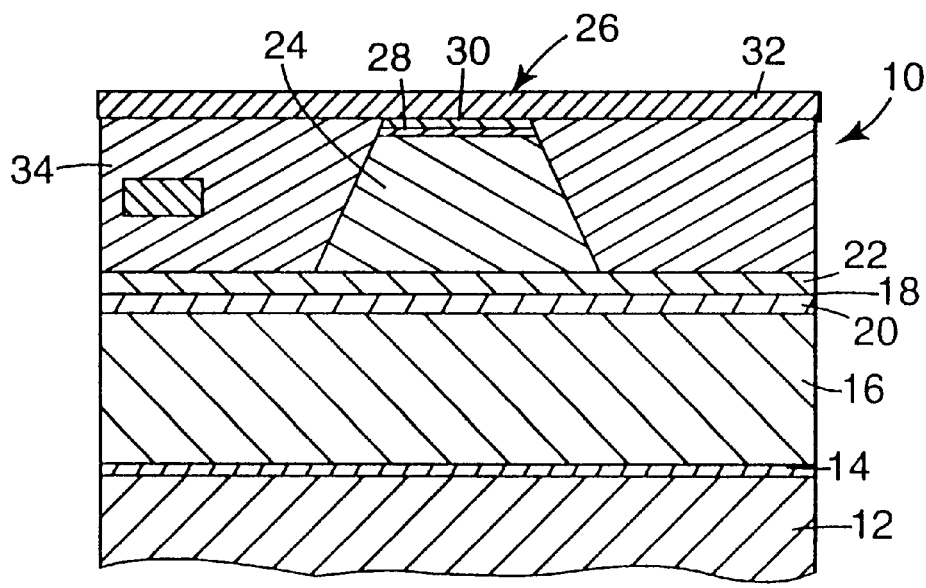
FIG. 1 is a simplified cross-sectional view of a light emitting device including a thick light absorbing layer in accordance with one embodiment of the present invention.

FIG. 1 is a simplified cross-sectional view of a laser diode 10 which is one example of II–VI semiconductor device in accordance with the present invention. Laser diode 10 includes GaAs substrate 12 which carries an ZnSe buffer layer 14. A MgZnSSe cladding layer 16 is carried on layer 14. A quantum well layer 18, for example CdZnSe, is sandwiched between guide layers 20 and 22, for example ZnSSe, carried on cladding layer 16. A second cladding layer 24 of MgZnSSe is deposited on guiding layer 22 and carries a p-type contact 26 having a layer 28 of ZnSeTe and a layer 30 of Pd-Au. A contact layer 32 of Ti-Au is deposited thereon.

In accordance with one aspect of the present invention, device 10 of FIG. 1 includes an absorbing layer 34 which is deposited on guiding layer 22 in those areas where cladding layer 24 is not present. In the embodiment of FIG. 1, absorbing layer 34 completely surrounds cladding layer 24.

The present invention recognizes that one of the failure mechanisms in II–VI semiconductor devices is the formation of "dark line defects" (DLDs). These features are collections of dislocation loops that grow out of pre-existing defects. In good crystals, the only pre-existing defects are stacking faults which originate at or near the GaAs-ZnSe interface. Recently, laser diode lifetimes have improved from a few seconds to many hours by reducing the density of these stacking faults in the grown epitaxial layers.

However, even devices that contain no stacking faults in the active region (typically a 5 $\mu$m×1000 $\mu$m stripe) eventually fail by dark line defects that flow from stacking faults located outside of the active region. The mechanism for this failure is that spontaneous light emission and scattered stimulated emission are efficiently guided out from the stripe and are absorbed by or near the stacking fault. The subsequent recombination of the photogenerated electron hole pair then drives the formation of the DLD from the stacking fault, just as it might in the active stripe itself.

In the present invention, light-absorbing layer 34 is added to the device 10. Absorbing layer 34 prevents light from being guided away from the active layer, and therefore slows or substantially eliminates failure due to DLDs propagating from defects located outside of the active stripe. In accordance with one aspect of the present invention, device 10 of FIG. 1 includes an absorbing layer 34 which is deposited on guiding layer 22 in those areas where cladding layer 24 is not present. In the embodiment of FIG. 1, absorbing layer 34 completely surrounds cladding layer 24.

The effect of the absorbing layer 34 is easily observed. In buried-ridge devices that do not have the inventive absorbing layer 34, light is visible from locations which are far from the stripe where it is generated, often several millimeters. Lasers with CdSe absorbing layer 34 showed no such stray light. It might be expected that these devices suffer from excessive optical absorption loss in the laser ridge waveguide itself, given that the CdSe absorbing layer abuts the ridge. Using an estimated complex refractive index for polycrystalline CdSe, 3D computer simulations as well as effective index modeling predict about 3 cm$^{-1}$ of loss for index guided lasers with 5 $\mu$m ridges, and only minimal loss (less than 1 cm$^{-1}$) for lasers with ridges wider than 10 $\mu$m.

Experiments on green lasers (510 nm) using 5 μm ridges indicate about 15 cm$^{-1}$ loss, which increases the threshold current density to 600 A/cm$^2$ (from about 450 A/cm$^2$) and reduces the differential quantum efficiency.

Figure 2:
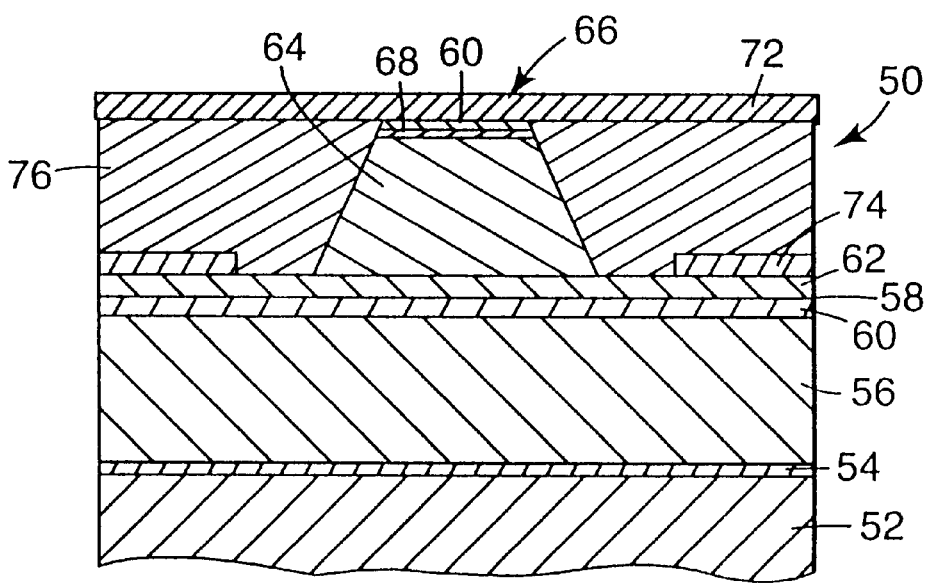
FIG. 2 is a simplified cross-sectional view of a light emitting device in accordance with another embodiment having a thin light absorbing layer spaced apart from a ridge of the device.

FIG. 2 is a simplified cross-sectional view of device 50 which is a II–VI laser diode in accordance with another embodiment. The performance of device 10 of FIG. 1 suffers in that absorbing layer 34 causes a reduction in device output. In the embodiment of FIG. 2, GaAs substrate 52 carries ZnSe layer 54. An MgZnSSe cladding layer 56 is carried on layer 54. A quantum well layer 58, for example CdZnSe, is sandwiched between guide layers 60 and 62, for example ZnSSe carried on cladding layer 56. A second cladding layer 64 of MgZnSSe is deposited on guiding layer 62 and carries a p-type contact 66 having a layer 68 of ZnSeTe and a layer 70 of Pd-Au. A contact layer 72 of Ti-Au is deposited thereon.

Device 50 includes a thin absorbing layer 74 in accordance with another embodiment of the invention. Layer 74 has a thickness of approximately 1000 Å. Note that in the embodiment of FIG. 2, layer 74 is spaced apart from ridge 64. The remainder of the space under contact (electrode) layer 72 is filled with a ZnS burying layer 76. Absorbing layer 74 may be fabricated using an additional photolithography step in which layer 74 is etched away in the area adjacent cladding layer 64. In one preferred embodiment, absorbing layer 74 is spaced apart about 8 μm from cladding layer 64. ZnS layer 76 is then deposited and is relatively thick, on the order of 1 μm. By removing portions of absorbing layer 74 adjacent cladding layer 64, portions of the optical mode which extends beyond cladding layer 64 will not be unnecessarily absorbed. However, the larger this area is, the greater the likelihood of a failure due to dark line defects. In another embodiment, a thinner absorbing layer 74 is used (about 400 Å thick) and the etched region is reduced to between 1 and 2 μm on each side of cladding layer 64. In general, the etched region should be greater than about 0.1 μm, and preferably greater than about 1.0 μm. Generally, the thickness of the absorbing layer should be greater than 50 Å.

Figure 3:
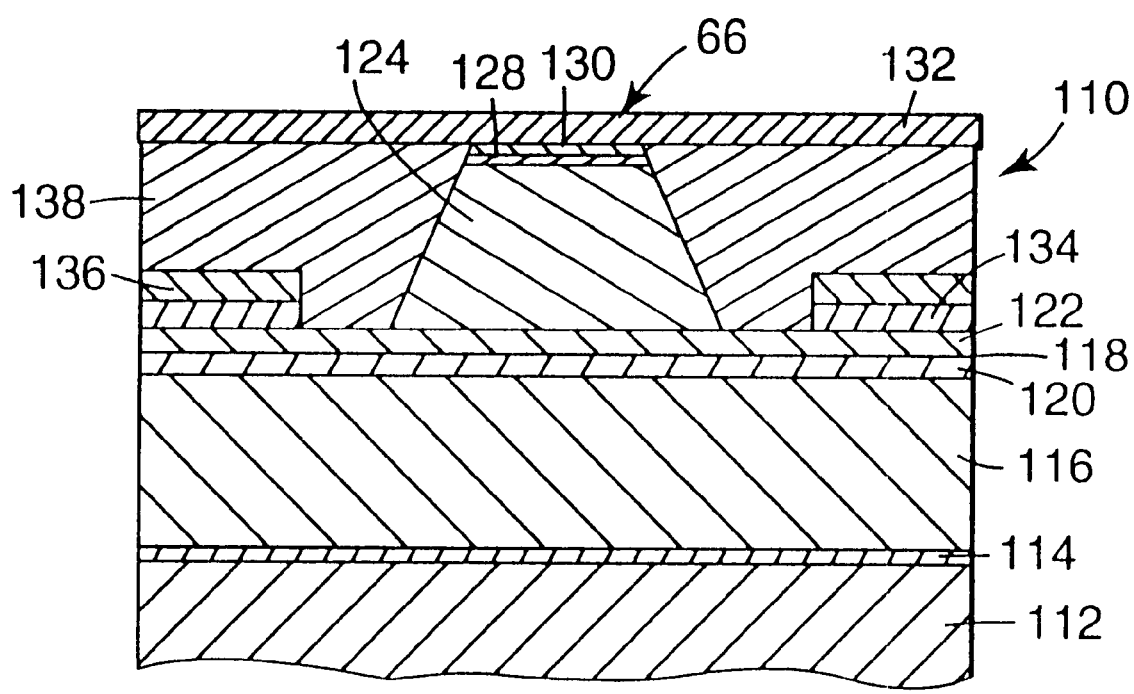
FIG. 3 is a simplified cross-sectional view of a light emitting device in accordance with another embodiment having a layer of high index, low loss material deposited upon the light absorbing layer.

FIG. 3 is a simplified cross-sectional view of a II–VI semiconductor laser diode 110 in accordance with another embodiment. Laser diode 110 includes GaAs substrate 112 which carries ZnSe layer 114. An MgZnSSe cladding layer 116 is carried on layer 114. A quantum well layer 118, for example CdZnSe, is sandwiched between guide layers 120 and 122, for example ZnSSe carried on cladding layer 116. A second cladding layer 124 of MgZnSSe is deposited on guiding layer 122 and carries a p-type contact 126 having a layer 128 of ZnSeTe and a layer 130 of Pd-Au. A contact layer 132 of Ti-Au is deposited thereon.

In one embodiment, the light emitting device is fabricated using the techniques taught in co-pending patent application, "Selective Etch for II–VI Semiconductors, U.S. Pat. No. 05,834,330. In this embodiment, the epitaxial II–VI semiconductor is patterned using conventional photolithography techniques to form an active region (typically a ridge waveguide) through etching techniques that may include the use of a selective etchant. Such selective etchants may be used to etch Mg-containing semiconductor cladding layers, e.g., MgZnSSe or BeMgZnSe, and stop at an etch-stop layer that does not contain Mg. The etch stop layers may include, for example, ZnSe, ZnSSe, BeZnSe. The etch-stop layer may be the guiding layer itself, or it may be an additional layer inserted in the cladding layer.

After etching, the absorbing layer is deposited on the surface of the device. Standard vacuum evaporation from a resistively-heated boat works well if CdSe is used. Alternative deposition techniques, such as sputtering may also be used. The thickness of CdSe is typically 40 nm. To remove the absorbing layer from the area nearest the active region, another photolithography step is used to form a mask for etching. The portions of the absorbing layer that are to be removed are exposed to an appropriate etchant and dissolved. In the case of CdSe absorbing layer, one etchant that works well is 2HCl:1 H$_2$O, which will remove 40 nm of CdSe in less than 20 seconds.

The photoresist used to pattern the absorbing layer is then removed, and a low-loss burying layer, e.g., ZnS, may be deposited and the device fabrication completed as taught in "Buried-Ridge II–VI Laser Diode," U.S. Pat. No. 5,404,027.

Other materials may be used for the absorbing layer, including Ge, Si, CdTe, CdS, HgS, HgSe, HgTe or ZnTe, depending on the wavelength of the light to be absorbed. Metals may also be used for the absorbing layer.

FIG. 3 shows another aspect of the present invention in which a thin absorbing layer 134 is deposited on guide layer 122. Further, a subsequent layer 136 of high index, low loss material is deposited on absorbing layer 134. Burying layer 138 of ZnS is deposited thereon. In the embodiment of FIG. 3, the high index, low loss layer 136 tends to "pull" the optical mode of device 110 upwards and out of the normal guiding layers 120 and 122. This causes the light to be more efficiently absorbed by absorbing layer 134. In one embodiment, absorbing layer 134 is 200 Å thick, high index, low loss layer 136 is 2000 Å thick and layer 138 is 1 μm. The configuration of layers 134, 136 and 138 of FIG. 3 causes the absorption length of the fundamental optical mode (outside of the ridge) to be reduced to less than 3 μm. In one embodiment layer 136 comprises a high index, low loss material such as ZnSe. However, any other appropriate material may be used such as CdS.

In one preferred embodiment, absorbing layers 34, 74, 134 are of CdSe. However, any appropriate material may be used for absorbing layer 34, 74, 134. Materials which are easily incorporated into the fabrication process are preferred.

Although the present invention has been described with reference to preferred embodiments, workers skilled in the art will recognize that changes may be made in form and detail without departing from the spirit and scope of the invention. It will be understood that the present invention may be used with any II–VI semiconductor device which may suffer from dark line defects. Additionally, the invention may be used in any situation in which it is desirable to absorb light in a specific region of the device. The absorbing layer may be used in, for example, laser diodes and light emitting diodes. The present invention is suitable for use in many devices, including an optical data storage system, an optical communications systems, an electronic system or an electronic display. The absorbing layer may be of any appropriate thickness, shape or material and these parameters may need to be adjusted for a particular use. These techniques are equally useful for Be-based lasers, as described in copending application "BE-CONTAINING II–VI BLUE-GREEN LASER DIODES," U.S. Pat. No. 05,818,859 commonly assigned with the present invention. The light absorbing layer may be formed of any appropriate material preferably compatible with the device and the fabrication process such as, for example, Ge, Si, CdTe, CdSe, ZnTe, HgSe, HgS, and HgTe.

What is claimed is:

1. A II–VI semiconductor light emitting device comprising:
   a II–VI semiconductor active region;
   a II–VI semiconductor waveguide layer operably coupled to the active region;
   a light absorbing layer proximate the II–VI semiconductor waveguide layer and lying outside of the active region, the light absorbing layer adapted to reduce formation of dark line defects; and
   a layer of high refractive index, low loss material deposited upon the light absorbing layer adjacent the waveguide layer to thereby define the waveguide layer.

2. The II–VI semiconductor light emitting device of claim 1 wherein the absorbing layer comprises CdSe.

3. The II–VI semiconductor light emitting device of claim 1 wherein the light absorbing layer is laterally spaced apart from the active region.

4. The II–VI semiconductor light emitting device of claim 3 wherein the light absorbing layer is laterally spaced more than about 0.1 $\mu$m from the active region.

5. The II–VI semiconductor light emitting device of claim 1 wherein the light absorbing layer has a thickness of more than about 50 Å.

6. The II–VI semiconductor light emitting device of claim 1 wherein the high refractive index, low loss material comprises ZnSe.

7. The II–VI semiconductor light emitting device of claim 1 wherein the high index, low loss material comprises CdS.

8. The II–VI semiconductor light emitting device of claim 1 wherein the light absorbing layer includes materials selected from the group consisting of Ge, Si, CdTe, CdSe, ZnTe, HgSe, HgS, and HgTe.

9. The II–VI semiconductor light emitting device of claim 1 including a cladding layer coupled to the waveguide layer.

10. The II–VI semiconductor light emitting device of claim 9 wherein the light absorbing layer surrounds the cladding layer.

11. The II–VI semiconductor light emitting device of claim 1 wherein the light absorbing layer comprises a metal.

12. An electronic system including the device of claim 1.

13. An optical data storage system including the device of claim 1.

14. An optical communications system including the device of claim 1.

15. An electronic display including the device of claim 1.

* * * * *